(12) United States Patent
Schwartz

(10) Patent No.: US 6,348,821 B1
(45) Date of Patent: Feb. 19, 2002

(54) FREQUENCY DOUBLER WITH 50% DUTY CYCLE OUTPUT

(75) Inventor: Reiner Schwartz, Grafing (DE)

(73) Assignee: STMicroelectronics S.R.L., Agrate Brianza (IT)

( * ) Notice: Subject to any disclaimer, the term of this patent is extended or adjusted under 35 U.S.C. 154(b) by 0 days.

(21) Appl. No.: 09/358,047

(22) Filed: Jul. 21, 1999

(30) Foreign Application Priority Data

Jul. 30, 1998 (EP) .............................. 98830467

(51) Int. Cl.[7] .............................................. H03B 19/00
(52) U.S. Cl. ........................ 327/122; 327/113; 327/116; 327/119
(58) Field of Search ................................. 327/113, 114, 327/115, 116, 117, 119, 120, 121, 122, 357, 359; 377/47, 48

(56) References Cited

U.S. PATENT DOCUMENTS 5,630,228 A  *  5/1997  Mittel .......................... 327/120
5,774,002 A  *  6/1998  Guo et al. .................... 327/165

FOREIGN PATENT DOCUMENTS

| EP | 0 343 898 A2 | 5/1989 |
| FR | 2.222.799 | 3/1974 |
| JP | 6116416 | 6/1986 |

OTHER PUBLICATIONS

Nagaraj, K. et al., A Frequency Doubler for Rectangular Inputs, Int. J. Electronics, 1984, vol. 56, No. 3, pp. 433–436.

* cited by examiner

*Primary Examiner*—Timothy P. Callahan
*Assistant Examiner*—An T. Luu
(74) *Attorney, Agent, or Firm*—Lisa K. Jorgenson; Allen, Dyer, Doppelt, Milbrath & Gilchrist, P.A.

(57) ABSTRACT

A frequency doubler circuit with a 50% duty cycle output includes a two-input XOR or XNOR logic gate having a first input coupled to a digital input signal having a first frequency, and a second input coupled to a replica of the input signal delayed by a quarter of the time period of the input signal. The frequency doubler circuit includes at least two capacitors in series, a constant current generator for charging the capacitors during one of the two half periods of the input signal, and first and second switches controlled in phase opposition by the input signal and by an inverted signal thereof for charging and discharging the capacitors during each period of the input signal. A voltage divider halves the voltage present on the capacitors so that a comparator senses the halved voltage on one of the two capacitors. The comparator provides an output signal to the second input of the logic gate.

35 Claims, 5 Drawing Sheets

FREQUENCY DOUBLER WITH 50% DUTY CYCLE OUTPUT

FIELD OF THE INVENTION

The present invention relates to the field of electronics, and, more particularly, to a frequency multiplying circuit.

BACKGROUND OF THE INVENTION

In digital processing circuitry, it is often necessary to double the frequency of a clock signal, or in general, to double the frequency of a digital signal having a 50% duty cycle. It is important to ensure that the output signal that has been doubled in frequency retains a 50% duty cycle. This output signal is often used to derive an internal frequency of four times the frequency of the input signal, and any deviation from the 50% duty cycle could induce an error in the higher frequency signals derived therefrom.

A circuit used for doubling the frequency of an input signal with a 50% duty cycle is shown in FIG. 1. The circuit uses an XNOR or an XOR gate having a first input coupled to the digital input signal CLK. The second input receives a replica of the input signal CLK delayed by a quarter of a time period using a delay line. The delay line includes a cascade of three identical inverters, and a capacitor connected between the coupling node of the output of the first inverter to the input of the second inverter and ground. The delay introduced by the delay line must be a quarter of the period time of the input signal CLK.

Referring to FIG. 2, waveforms of the signals indicated in FIG. 1 are illustrated. These signals are the output signal of the XNOR gate and the corresponding input signals. The output signal is at a high logic level. Increasing frequencies of the processed digital signals and stricter precision requirements for sampling frequencies make it difficult to ensure that the delay times of the components of the delay line of the circuit in FIG. 1 match to provide the required quarter of a time period delay.

SUMMARY OF THE INVENTION

The above described difficulties of the prior art circuit are overcome by a circuit according to the present invention while providing a 50% duty cycle of the output signal.

The circuit includes a comparator for sensing when a voltage on a capacitor charged with a constant current during a phase of the input signal of 50% duty cycle reaches a half of its full charge swing. Half of the voltage of the charging process of the capacitor is accomplished during one phase of the 50% duty cycle of the input signal. Since this voltage is reached at half the time interval of the charging phase, the comparator output switches at substantially a quarter of the period of the input signal.

Instead of using a resistive voltage divider of the voltage present on the charging capacitor, the latter may be made up of two capacitors of identical value connected in series. The comparator senses the voltage present on one of the two capacitors in series.

A constant current generator and a switch controlled by the input signal and by its inverse signal, or by functionally equivalent control signals, operatively provide for a linear charging of the capacitor or capacitors in series during a first half period of the input signal. The constant current generator and switch operatively provide for a complete discharge of the capacitor or of the capacitors in series during the following half period of the input signal. Also, the discharging may be after the switching of the half-swing sensing comparator.

The output gate may either be an XNOR or an XOR gate. The capacitor charging and discharging circuit and the relative comparator may be duplicated according to a common dual architecture of digital circuitry.

BRIEF DESCRIPTION OF THE DRAWINGS

The different aspects and advantages of the invention will become clearer through the following description and illustrations of embodiments thereof and by referring to the attached drawings, wherein.

DETAILED DESCRIPTION OF THE PREFERRED EMBODIMENTS

Figure 1:
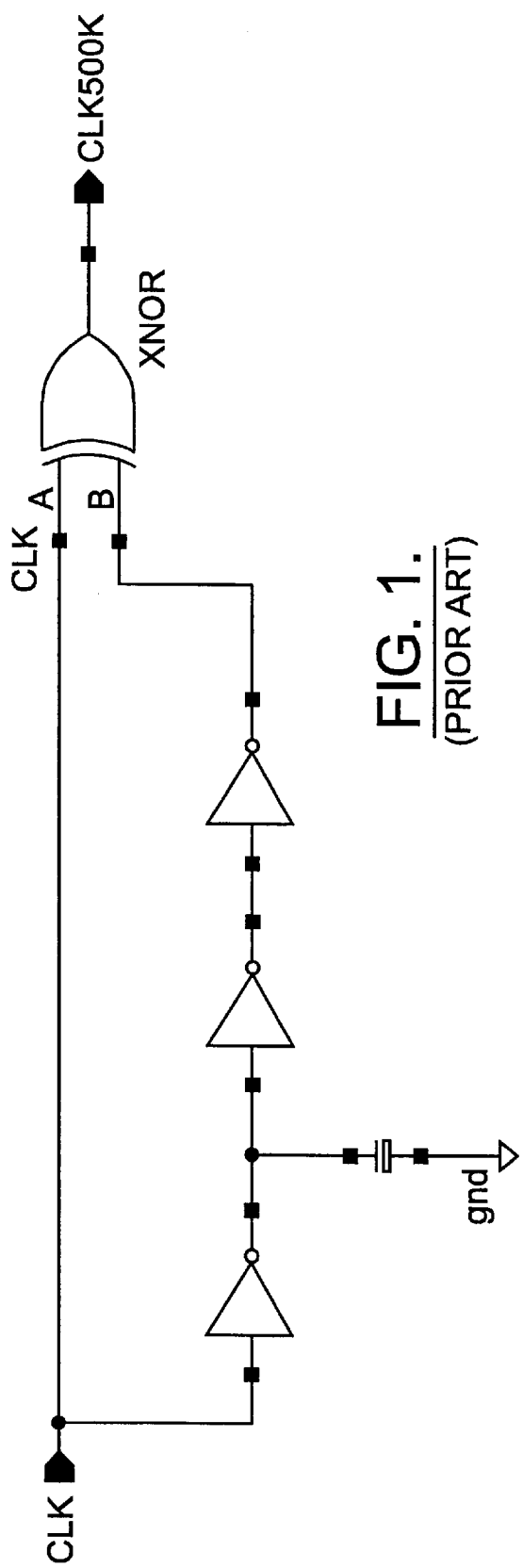
FIG. 1 shows a frequency doubler circuit, according to the prior art.
Figure 2:
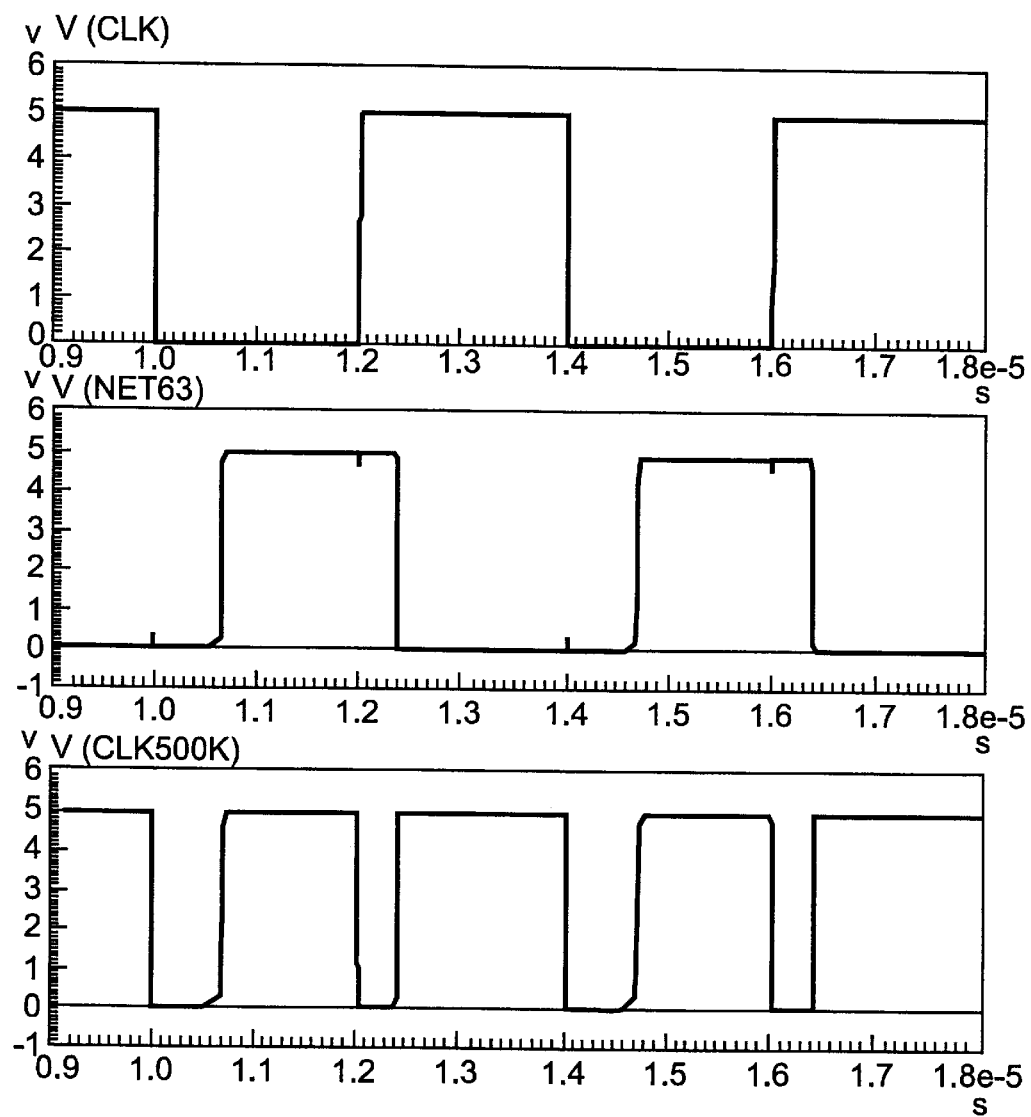
FIG. 2 shows the relevant signals for the circuit illustrated in FIG. 1.
Figure 3:
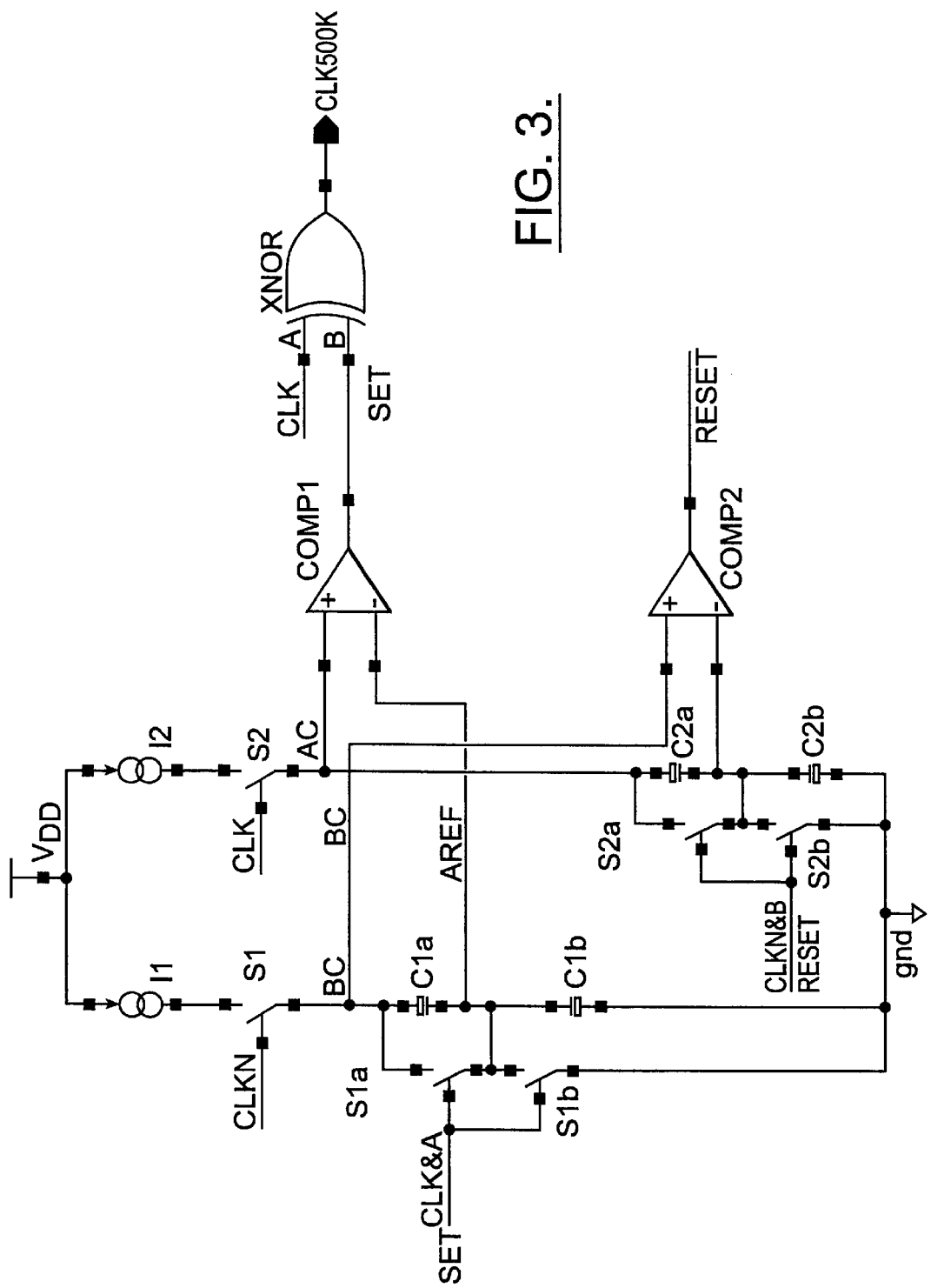
FIG. 3 is top level circuit diagram of a frequency doubler circuit, according to the present invention.
Figure 4:
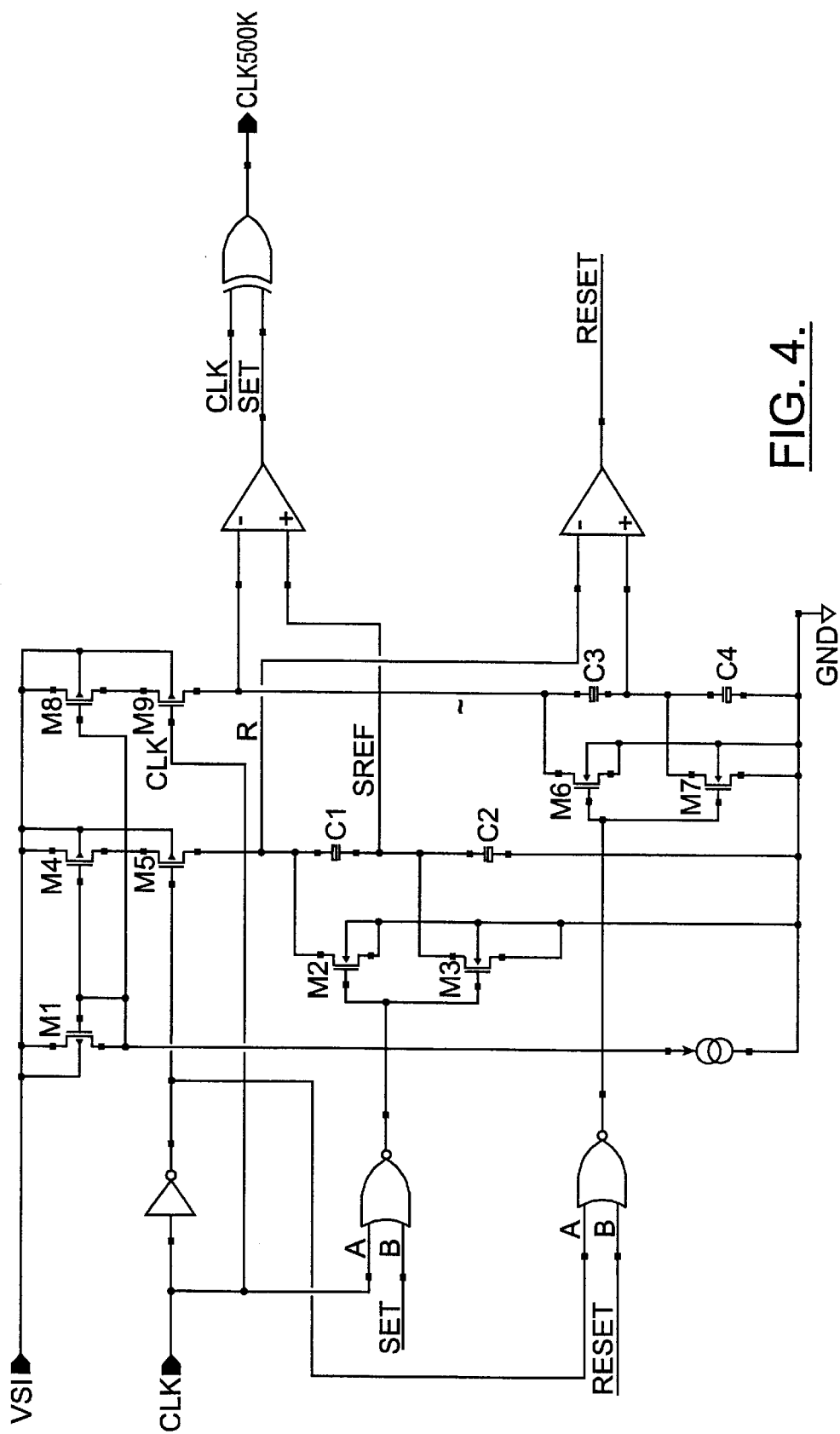
FIG. 4 is a more detailed circuit diagram of the top level circuit illustrated in FIG. 3.
Figure 5:
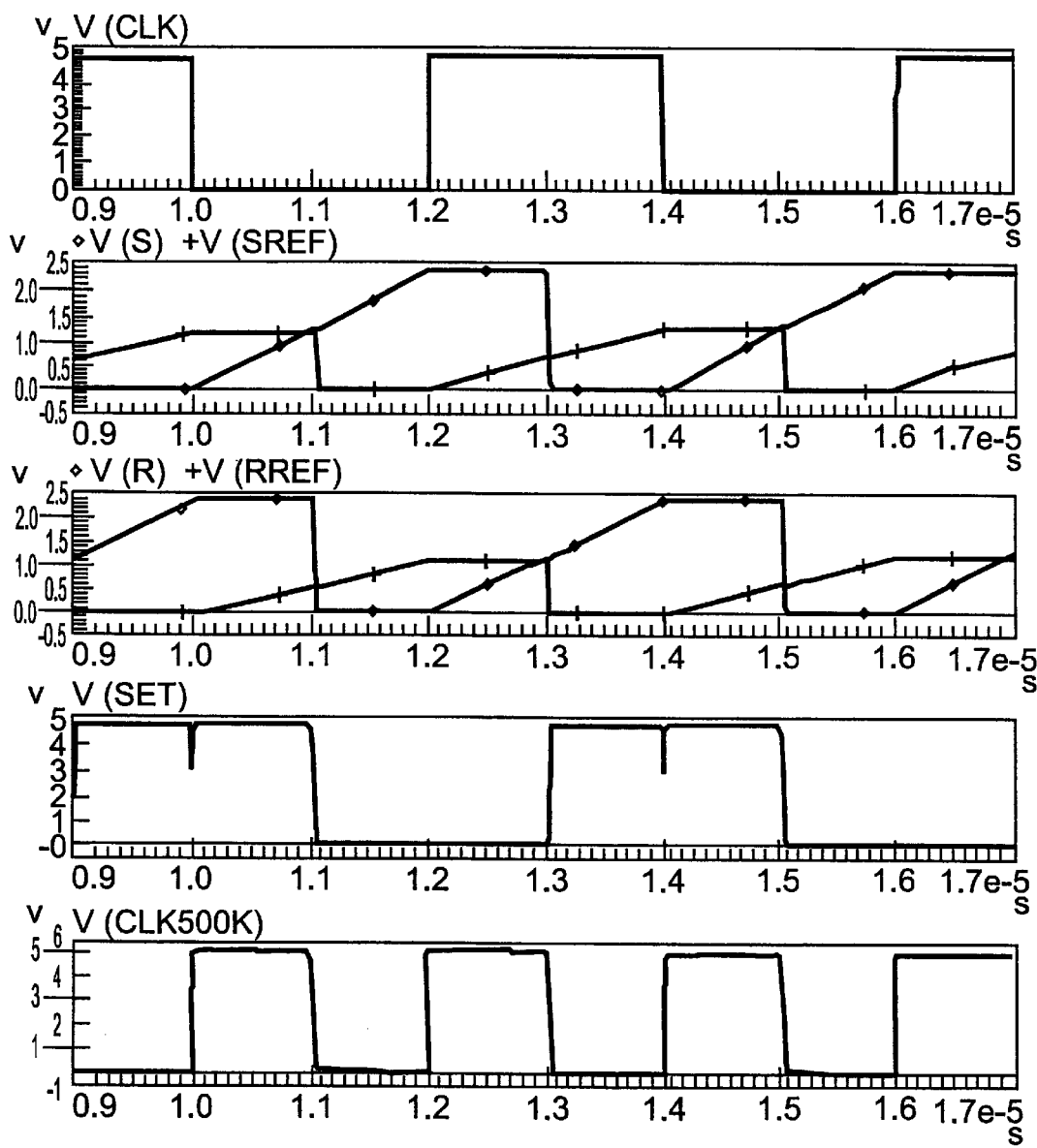
FIG. 5 shows the relevant signals for the circuit illustrated in FIG. 4.

In FIGS. 3–5, a dual implementation of the circuit of the present invention is illustrated without intending to limit its implementation to a dual form. With reference to the top level circuit diagram of FIG. 3, the first input of the XNOR output gate is coupled to the input signal CLK, while the second input is coupled to the output of the comparator COMP 1.

The comparator COMP 1 senses the voltage present on the capacitor C1$a$, which has the same capacitance value of the capacitor C1$b$ connected in series thereto. The capacitors C1$a$ and C1$b$ in series are charged with a constant current generated by the current generator I1 during one phase of the input signal CLK, and are discharged during the successive phase of the input signal CLK. The charging and discharging processes are controlled by the switches S1, S1$a$ and S1$b$.

A dual duplication of the circuit is formed by the current generator I2, the capacitors C2$a$ and C2$b$ connected in series, the switches S2, S2$a$ and S2$b$, and the comparator COMP2. The capacitors C2$a$ and C2$b$ may have the same capacitance value as the pair of capacitors C1$a$ and C1$b$. If the duty cycle of the input signals CLK is 50% and the current sources I1 and I2 are identical, the dual signals of opposite phase output by the comparators COMP1 and COMP2 will be delayed by a quarter of the time period of the input signal CLK. This delay is with respect to the corresponding transitions of the input signal CLK.

The signals output by the two comparators COMP1 and COMP2 are used for controlling the switches. A more detailed circuit implementation of the circuit illustrated in FIG. 3 is shown in FIG. 4. Also illustrated are the drives that implement the switches that control the charging and discharging processes of the two pairs of series connected capacitors. Instead of a pair of capacitors of equal value connected in series, a single capacitor may be used and half of the voltage on it can be sensed by the use of a resistive voltage divider functionally connected in parallel to the capacitor.

The relevant signals for the circuit illustrated in FIG. 4 are shown FIG. 5. Another possible alternative embodiment of the circuit of the invention uses a single comparator instead of two comparators COMP1 and COMP2. This is done by using additional switches for switching the inputs of the single comparator to one of the sensing lines according to switching techniques used in integrated circuits, as readily known by one skilled in the art.

That which is claimed is:

1. A frequency doubler circuit having a 50% duty cycle output comprising:
    a logic gate including a first input receiving a digital input signal having a first frequency and a 50% duty cycle, and a second input receiving a replica signal of the digital input signal, the replica signal being delayed by a quarter of a period of the digital input signal and having the 50% duty cycle;
    at least one capacitor;
    a current generator for charging said at least one capacitor during one of two half periods of the digital input signal;
    first and second switch circuits controlled in phase opposition for charging and discharging said at least one capacitor during each period of the digital input signal;
    a voltage dividing circuit dividing in half a voltage present on said at least one capacitor; and
    at least one comparator having a first input for sensing the halved voltage present on the at least one capacitor and a second input for receiving the digital input signal, and having an output coupled to the second input of said logic gate providing the replica signal.

2. A frequency doubler circuit according to claim 1, wherein said at least one capacitor comprises a pair of series connected capacitors having a substantially same capacitance, wherein said pair of capacitors are charged and discharged by said current generator and said first and second switch circuits, and wherein said at least one comparator senses the halved voltage on one of said pair of capacitors.

3. A frequency doubler circuit according to claim 1, wherein said at least one capacitor comprises a single capacitor charged and discharged by said current generator and said first and second switch circuits; said voltage dividing circuit comprises a resistive voltage divider connected in parallel to said single capacitor so that said at least one comparator senses the halved voltage on said single capacitor via said resistive voltage divider.

4. A frequency doubler circuit according to claim 1, further comprising:
    at least one second capacitor;
    a second current generator for charging said at least one second capacitor during one of two half periods of the digital input signal;
    third and fourth switch circuits controlled in phase opposition for charging and discharging said at least one second capacitor during each period of the digital input signal;
    a second voltage dividing circuit dividing in half a voltage present on said at least one second capacitor; and
    at least one second comparator having a first input for sensing the halved voltage present on the at least one second capacitor and a second input for receiving the inverted digital input signal, and having an output coupled to said third and fourth switch circuits.

5. A frequency doubler circuit according to claim 4, wherein said at least one second capacitor comprises a second pair of series connected capacitors having a substantially same capacitance, wherein said second pair of capacitors are charged and discharged by said second current generator and said third and fourth switch circuits, and wherein said at least one second comparator senses the halved voltage on one of said second pair of capacitors.

6. A frequency doubler circuit according to claim 4, wherein said at least one second capacitor comprises a single capacitor charged and discharged by said current generator and said third and fourth switch circuits; said voltage dividing circuit comprises a second resistive voltage divider connected in parallel to said single capacitor so that said at least one comparator senses the halved voltage on said single capacitor via said second resistive voltage divider.

7. A frequency doubler circuit according to claim 1, wherein said logic gate comprises an XOR gate.

8. A frequency doubler circuit according to claim 1, wherein said logic gate comprises an XNOR gate.

9. A frequency multiplier circuit comprising:
    a logic gate including a first input receiving an input signal having a first frequency, and a second input receiving a replica signal of the input signal, the replica signal being delayed with respect to a period of the input signal;
    at least one capacitor;
    a current generator for charging said at least one capacitor during a portion of the period of the input signal;
    first and second switch circuits controlled in phase opposition for charging and discharging said at least one capacitor during each period of the input signal;
    a voltage dividing circuit dividing a voltage present on said at least one capacitor; and
    at least one comparator having a first input for sensing the divided voltage present on the at least one capacitor and a second input for receiving the input signal, and having an output coupled to the second input of said logic gate providing the replica signal.

10. A frequency multiplier circuit according to claim 9, wherein said at least one capacitor comprises a pair of series connected capacitors having a substantially same capacitance, wherein said pair of capacitors are charged and discharged by said current generator and said first and second switch circuits, and wherein said at least one comparator senses the divided voltage on one of said pair of capacitors.

11. A frequency multiplier circuit according to claim 9, wherein said at least one capacitor comprises a single capacitor charged and discharged by said current generator and said first and second switch circuits; said frequency doubler circuit further comprising a resistive voltage divider connected in parallel to said single capacitor so that said at least one comparator senses the divided voltage on said single capacitor via said resistive voltage divider.

12. A frequency multiplier circuit according to claim 9, further comprising:
    at least one second capacitor;
    a second current generator for charging said at least one second capacitor during a portion of the period of the input signal;
    third and fourth switch circuits controlled in phase opposition for charging and discharging said at least one second capacitor during each period of the input signal;
    a second voltage dividing circuit dividing a voltage present on said at least one second capacitor; and
    at least one second comparator having a first input for sensing the divided voltage present on the at least one second capacitor and a second input for receiving the inverted input signal, and having an output coupled to said third and fourth switch circuits.

13. A frequency multiplier circuit according to claim 12, wherein said at least one second capacitor comprises a second pair of series connected capacitors having a substantially same capacitance, wherein said second pair of capacitors are charged and discharged by said second current generator and said third and fourth switch circuits, and wherein said at least one second comparator senses the divided voltage on one of said second pair of capacitors.

14. A frequency multiplier circuit according to claim 12, wherein said at least one second capacitor comprises a single capacitor charged and discharged by said current generator and said third and fourth switch circuits; said frequency doubler circuit further comprising a second resistive voltage divider connected in parallel to said single capacitor so that said at least one comparator senses the divided voltage on said single capacitor via said second resistive voltage divider.

15. A frequency multiplier circuit according to claim 9, wherein said logic gate comprises an XOR gate.

16. A frequency multiplier circuit according to claim 9, wherein said logic gate comprises an XNOR gate.

17. A frequency multiplier circuit according to claim 9, wherein the input signal has a duty cycle of 50% and an output signal of said logic gate has a duty cycle of 50%.

18. A frequency multiplier circuit according to claim 9, wherein an output signal of said logic gate is twice the first frequency of the input signal.

19. A frequency multiplier circuit comprising:
a logic gate including a first input receiving an input signal having a first frequency, and a second input receiving a replica signal of the input signal, the replica signal being delayed with respect to a period of the input signal;
a pair of series connected capacitors having a substantially same capacitance;
a current generator for charging said pair of capacitors during a portion of the period of the input signal;
first and second switch circuits controlled in phase opposition for charging and discharging said pair of capacitors during each period of the input signal;
a voltage dividing circuit cooperating with said first and second switch circuits for dividing a voltage present on said pair of capacitors; and
at least one comparator having a first input for sensing the divided voltage present on one of said pair of capacitors and a second input for receiving the input signal, and having an output coupled to the second input of said logic gate providing the replica signal.

20. A frequency multiplier circuit according to claim 19, further Comprising:
a second pair of series connected capacitors having a substantially same capacitance;
a second current generator for charging said second pair of capacitors during a portion of the period of the input signal;
third and fourth switch circuits controlled in phase opposition for charging and discharging said second pair of capacitors during each period of the input signal;
a voltage dividing circuit cooperating with said third and fourth switch circuits dividing a voltage present on said second pair of capacitors; and
at least one comparator having a first input for sensing the divided voltage present on one of said second pair of capacitors and a second input for receiving the inverted input signal, and having an output coupled to said third and fourth switch circuits.

21. A frequency multiplier circuit according to claim 19, wherein said logic gate comprises an XOR gate.

22. A frequency multiplier circuit according to claim 19, wherein said logic gate comprises an XNOR gate.

23. A frequency multiplier circuit according to claim 19, wherein the input signal has a duty cycle of 50% and an output signal of said logic gate has a duty cycle of 50%.

24. A frequency multiplier circuit according to claim 19, wherein an output signal of said logic gate is twice the first frequency of the input signal.

25. A method for doubling a frequency of an input signal, the method comprising:
applying the input signal having a first frequency to a first input of a logic gate;
generating a replica signal of the input signal and applying the replica signal to a second input of the logic gate, the replica signal being delayed with respect to a period of the input signal, and generating the replica signal comprising
charging at least one capacitor during a portion of the period of the input signal,
controlling first and second switch circuits in phase opposition for charging and discharging the at least one capacitor during each period of the input signal,
dividing a voltage present on the at least one capacitor, and
sensing the divided voltage and comparing with the input signal to provide the replica signal.

26. A method according to claim 25, wherein the at least one capacitor comprises a pair of series connected capacitors having substantially a same capacitance; and wherein dividing the voltage comprises dividing the voltage equally between the pair of capacitors.

27. A method according to claim 25, wherein the at least one capacitor comprises a single capacitor; and wherein dividing the voltage comprises using a resistive voltage divider connected in parallel to the single capacitor to divide the voltage present on the single capacitor.

28. A method according to claim 25, further comprising generating a second signal that is doubled in frequency with respect to the input signal.

29. A method according to claim 28, wherein providing the second signal comprises:
charging at least one second capacitor during a portion of the period of the input signal:
controlling third and fourth switch circuits in phase opposition for charging and discharging the at least one second capacitor during each period of the input signal;
dividing a voltage present on the at least one second capacitor; and
sensing the divided voltage and comparing with the inverted input signal to provide a switching signal for the third and fourth switch circuits.

30. A method according to claim 29, wherein the fourth switch circuit is controlled responsive to the switching signal.

31. A method according to claim 29, wherein the at least one second capacitor comprises a second pair of series connected capacitors having substantially a same capacitance; and wherein dividing the voltage comprises dividing the voltage equally between the second pair of capacitors.

32. A method according to claim 29, wherein the at least one second capacitor comprises a single capacitor; and wherein dividing the voltage comprises using a resistive voltage divider connected in parallel to the single capacitor to divide the voltage present on the single capacitor.

33. A method according to claim 26, wherein the logic gate comprises an XOR gate.

34. A method according to claim 25, wherein the logic gate comprises an XNOR gate.

35. A method according to claim 25, wherein charging is performed using a current generator.

* * * * *

UNITED STATES PATENT AND TRADEMARK OFFICE
CERTIFICATE OF CORRECTION

PATENT NO. : 6,348,821 B1
DATED : February 19, 2002
INVENTOR(S) : Reiner Schwartz It is certified that error appears in the above-identified patent and that said Letters Patent is hereby corrected as shown below:

Column 2,
Line 16, delete "is top" insert -- is a top --
Line 64, delete "FIG. 5." insert -- in FIG. 5. --

Column 5,
Line 50, delete "Comprising:" insert -- comprising: --

Column 7,
Line 1, delete "claim 26" insert -- claim 25 --

Signed and Sealed this

Twenty-fifth Day of February, 2003

JAMES E. ROGAN
*Director of the United States Patent and Trademark Office*